United States Patent
Van Veldhoven

(10) Patent No.: US 7,557,741 B2
(45) Date of Patent: Jul. 7, 2009

(54) OVERLOAD DETECTION UNIT WITH SIGNAL STRENGTH INDICATOR TO INDICATE AN OVERLOAD CONDITION

(75) Inventor: Robert Van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/910,451

(22) PCT Filed: Mar. 28, 2006

(86) PCT No.: PCT/IB2006/050937

§ 371 (c)(1),
(2), (4) Date: Oct. 1, 2007

(87) PCT Pub. No.: WO2006/103626

PCT Pub. Date: Oct. 5, 2006

(65) Prior Publication Data

US 2008/0191914 A1    Aug. 14, 2008

(30) Foreign Application Priority Data

Apr. 1, 2005    (EP) .................................. 05300243

(51) Int. Cl.
*H03M 1/00* (2006.01)
(52) U.S. Cl. .................. 341/139; 341/143; 341/155
(58) Field of Classification Search .................. 341/139, 341/143, 155
See application file for complete search history.

(56) References Cited

U.S. PATENT DOCUMENTS

| | | | |
|---|---|---|---|
| 5,012,244 A | 4/1991 | Wellard et al. | |
| 6,314,278 B1 * | 11/2001 | Zamat | 455/239.1 |
| 6,459,397 B1 * | 10/2002 | Olgaard et al. | 341/143 |
| 6,512,472 B1 | 1/2003 | Smith et al. | |
| 6,538,588 B1 | 3/2003 | Bazarjani | |
| 6,563,891 B1 | 5/2003 | Eriksson et al. | |
| 6,668,027 B1 * | 12/2003 | Scarpa | 375/345 |
| 6,993,291 B2 * | 1/2006 | Parssinen et al. | 455/67.11 |
| 7,262,724 B2 * | 8/2007 | Hughes et al. | 341/139 |
| 2003/0081706 A1 | 5/2003 | Ciccarelli et al. | |
| 2004/0116092 A1 | 6/2004 | Hessel et al. | |
| 2004/0161026 A1 | 8/2004 | Jensen et al. | |
| 2007/0035430 A1 * | 2/2007 | Schreier et al. | 341/143 |

FOREIGN PATENT DOCUMENTS

WO    0243253 A2    5/2002

* cited by examiner

*Primary Examiner*—Khai M Nguyen
(74) *Attorney, Agent, or Firm*—Peter Zawilski

(57) ABSTRACT

A device is for digitally processing an input signal that is susceptible to variations in signal strength. The signal (48) is analog to digital converted into a bitstream signal (47), the bitstream signal representing the input signal by consecutive digital values. The device has a signal strength detection circuit (32) for generating a control signal indicative for an overload condition in which the signal strength exceeds a input range of the analog to digital converter, e.g. a sigma-delta modulator. The signal strength detection circuit detects, in the bitstream signal, a sequence (49,50) of adjacent and equal digital values, the sequence having at least a predetermined length. The circuit detects the overload condition effectively and fast, avoiding the delay of signal strength detection in a digital processor.

9 Claims, 3 Drawing Sheets

Figure 1:
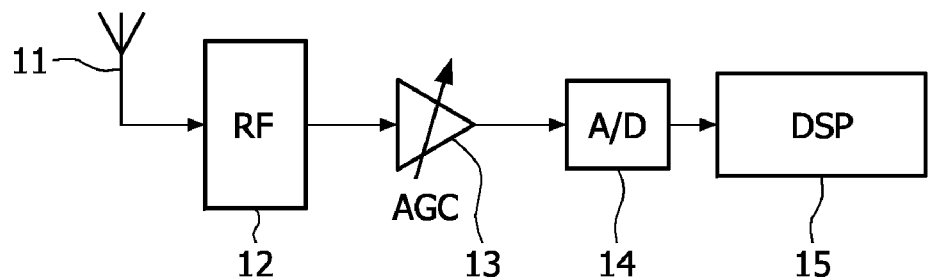

OVERLOAD DETECTION UNIT WITH SIGNAL STRENGTH INDICATOR TO INDICATE AN OVERLOAD CONDITION

The invention relates to a device for digitally processing an input signal that is susceptible to variations in signal strength and is converted by an analog to digital converter into a bitstream signal to be processed, the bitstream signal representing the input signal by consecutive digital values.

The invention further relates to a mobile communication device comprising the device for digitally processing the analog input signal.

The invention relates to the field of detecting overload of analog to digital conversion, and in particular to providing a control signal for automatic gain control.

The document U.S. Pat. No. 6,538,588 describes an analog to digital (A/D) converter, in particular a converter of a sigma-delta (ΣΔ) type in a digital communications receiver device. In such a communications system an analog input signal that is susceptible to variations in signal power comprises an information signal component to be isolated from further signal components. The analog input signal is coupled to an input summing node of the A/D converter. The A/D converter has at least one loop that loops a generated digital output signal back to the input summing node, the loop including a loop filter coupled to a quantizer that provides the output signal. The dynamic range of the A/D converter is enhanced by a preceding amplifier stage having a variable gain that is controlled by a gain control signal. A power detector is used to detect the power level of the analog input signal for generating the gain control signal. For example an analog power detector may be used at the input signal or, as further described in US2003/081706, a digital received signal strength indicator (RSSI) may be applied to control analog filter circuitry. For example, in US 2004/0161026 a power level of a desired signal element in the input signal is digitally measured after digital signal processing. Also the dynamic range of the ΣΔ A/D converter may be set in dependence of the operating mode of the receiver device. However, the known ways of detecting the power level for controlling the dynamic range of the A/D converter are not sufficiently quick and accurate, and may require complex, additional circuitry. In particular detecting the power of the desired signal after digital processing may be accurate, but does not respond quickly to variations in the power level due to the substantial delay caused by the digital processing.

It is an object of the invention to provide a device for digitally processing an input signal having a signal strength detector that does not require complex circuits and responds quickly to variations in power level.

For this purpose, according to a first aspect of the invention the device for digitally processing an input signal as described in the opening paragraph comprises a signal strength detection circuit for generating a control signal indicative for an overload condition in which the signal strength exceeds an input range of the analog to digital converter, the signal strength detection circuit comprising detection means for detecting in the bitstream signal a sequence of adjacent and equal digital values, the sequence having at least a predetermined length.

For this purpose, according to a second aspect of the invention the mobile communication device as described in the opening paragraph comprises the above device for digitally processing an input signal and a receiving unit for providing the input signal.

The input range of an analog to digital converter is the range of input signal values between the minimal and maximal boundary values, e.g. the lowest negative and the highest positive input signal value that can be operationally converted into digital values. When the input range is exceeded by the input signal, this is called overload. The measures have the effect that the overload condition of the analog to digital converter is quickly detected, because the detection circuit directly acts on the bitstream signal. Surprisingly, the detection of the sequence provides an effective detection of the overload condition using only fairly limited circuit resources.

The invention is also based on the following recognition. For many applications there is no need for fast and detailed signal strength information when the input signal is within the dynamic range of the analog to digital converter, because further digital processing is accurate and may provide digital signal strength information. However, due to the nature of such processing, a delay occurs and no fast response is available to changing input signal conditions. Moreover, when the input signal exceeds the input range of the analog to digital converter, the digital information is unreliable. The inventors have seen that detecting of the length of sequences of maximum or minimum digital values directly on the bitstream signal provides fast and reliable overload detection. Hence advantageously the signal overload detection is not delayed by the digital processing, and is not complex due to the simple detection of a number of subsequent equal values in the bitstream signal, which for example reduces the amount of chip area required for integration. Moreover, in the known solutions the transition from the analog domain to the digital domain usually occurs as soon as possible after receiving analog input signals, and power detection is implemented in a single unit in either one of the domains. However, the inventor has seen that the part of the function of signal strength detection may be separately implemented by the current overload detection directly at the bitstream, e.g. immediately after the domain transition point. Hence the effects of a too strong analog input signal are immediately detected.

In an embodiment of the device the detection means are arranged for detecting the sequence by detecting a consecutive number of digital signal values of a minimum digital value occurring within the bitstream, or a consecutive number of digital signal values of a maximum digital value occurring within the bitstream, the consecutive number being equal to or larger than the predetermined length. This has the advantage that the length of the sequence is effectively detected, e.g. from a sequence of consecutive zeroes or ones in a binary bitstream signal. In a particular effective embodiment the predetermined length is between 8 and 16. Surprisingly such a fixed number provides reliable overload detection of practical input signals.

In an embodiment of the device the signal strength detection circuit comprises overload condition means for detecting the overload condition based on one or more overload criteria, the overload criteria including a number of sequences in a predetermined detection time interval; lengths of subsequent sequences; occurrence of at least one sequence of a minimum digital value occurring within the bitstream and at least one sequence of a maximum digital value occurring within the bitstream. By applying such overload criteria the signal properties of the signal to be processed are taken into account. This has the advantage that the overload condition is accurately detected.

Further preferred embodiments of devices according to the invention are given in the appended claims, disclosure of which is incorporated herein by reference.

Figure 2:
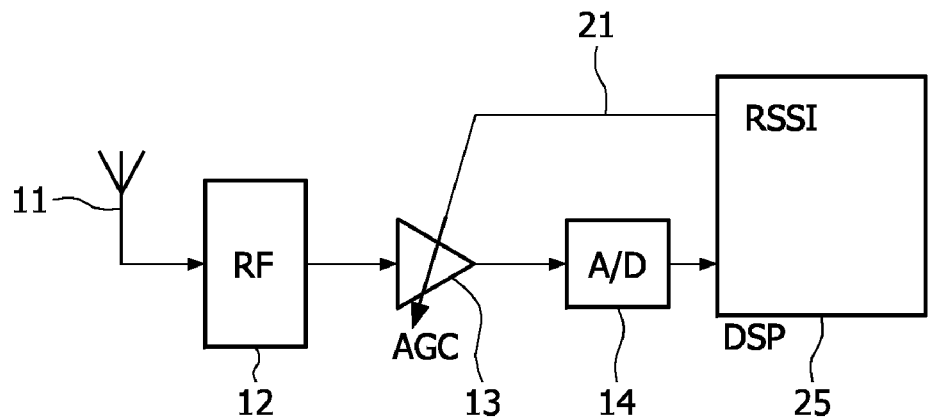
Figure 3:
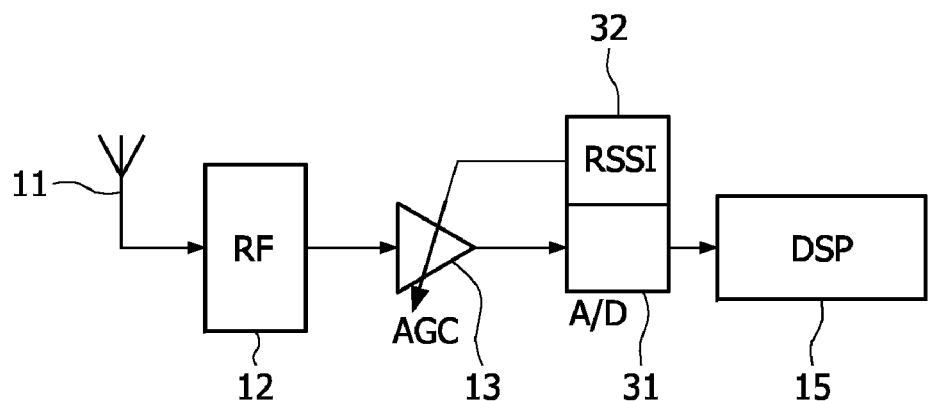
Figure 4:
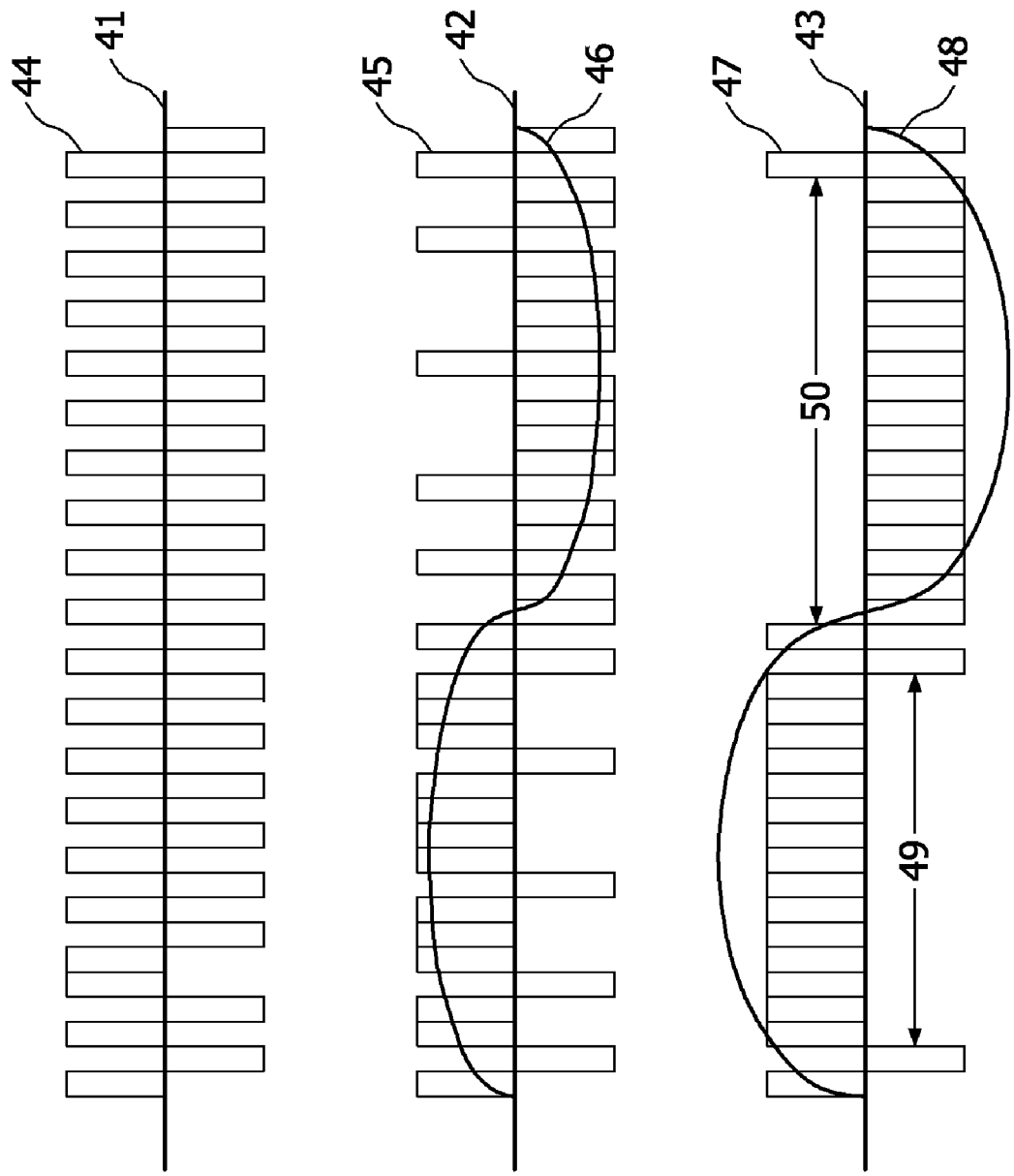
Figure 5:
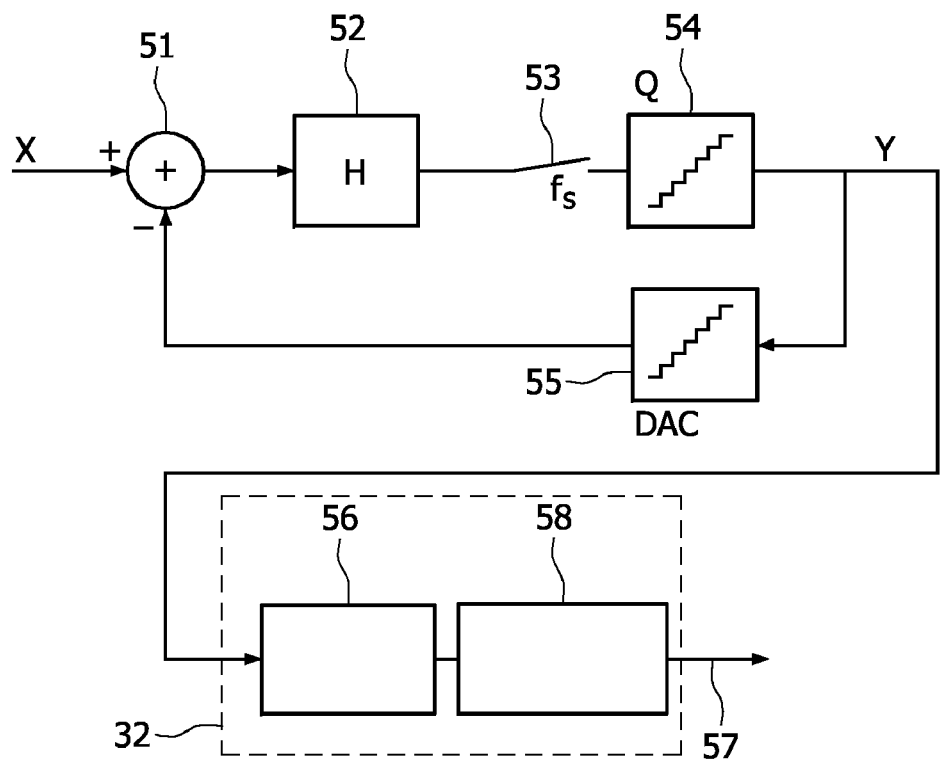
Figure 6:
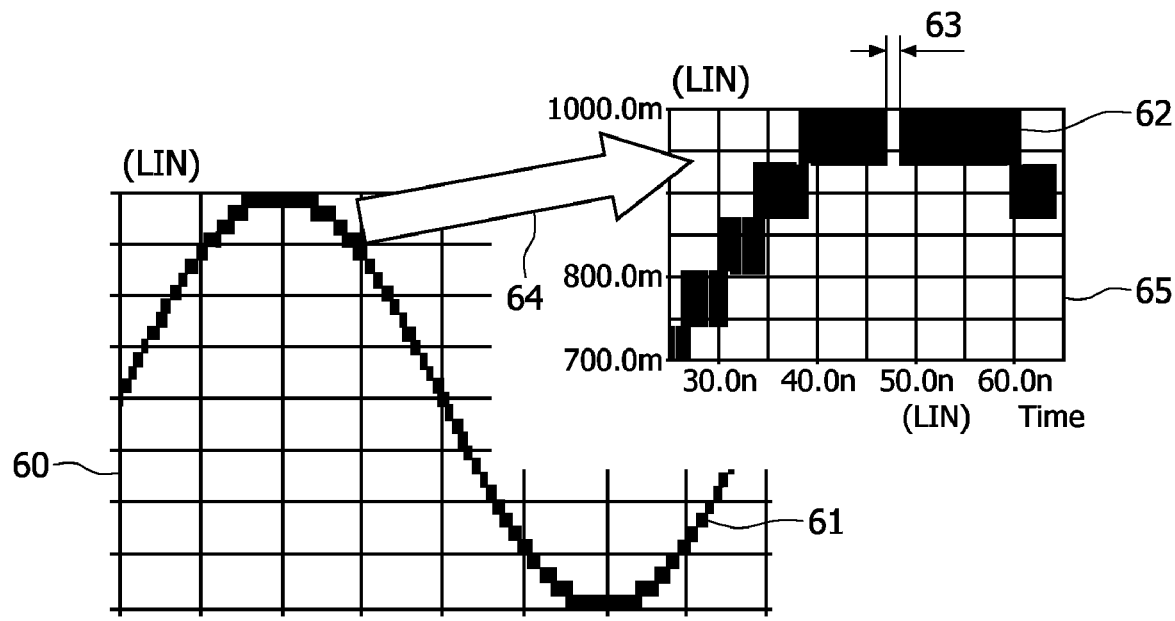

These and other aspects of the invention will be apparent from and elucidated further with reference to the embodiments described by way of example in the following description and with reference to the accompanying drawings, in which FIG. 1 shows a diagram of a prior-art receiver device, FIG. 2 shows a diagram of a prior-art receiver device having a signal strength detector in the digital signal processor, FIG. 3 shows a signal strength detector coupled to an analog to digital converter, FIG. 4 shows a bitstream signal, FIG. 5 shows a sigma-delta analog to digital converter and an overload detection unit, and FIG. 6 shows an output signal of a multi-bit sigma-delta modulator. Corresponding elements in different Figures have identical reference numerals.

FIG. 1 shows a diagram of a prior-art receiver device. The device has an antenna 11 coupled to a radio frequency front end 12. The analog signal from the front end 12 is coupled to an amplifier 13 having an automatic gain control, e.g. by measuring the signal power in an analog signal strength detector circuit at the output of the amplifier 13. The amplifier provides the amplified analog signal to an analog to digital converter 14 (ADC), which provides a digital signal to the digital signal processor 15. In such digitized receiver architectures the A/D converter is present somewhere in the receiver chain to convert the information signal of a wanted channel into the digital domain. This digitization leads to more flexible receiver architecture, e.g. channel filtering and demodulation can be done in the digital domain. The RF front-end 12 in the Figure converts received radio signal including the wanted channel to an IF frequency (which may be zero), and also does preparatory signal conditioning such as amplification and channel filtering to attenuate neighboring channels and interferers. If the signal strength of the wanted channel is only small or too big, the AGC amplifier 13 is used to amplify or attenuate the incoming signal to condition it in such a way it can be converted into the digital domain properly. This means that the wanted signal is put as close as possible at the maximum input level of the ADC, causing the noise contribution of the ADC to be as low as possible. The problem is how to set the AGC. A way of setting the AGC is to measure the input power of the ADC in an analog way. An advantage of this topology is that it is fast because the input power is measured in front of the ADC. This topology also has a big disadvantage: it needs complicated analog circuitry.

FIG. 2 shows a diagram of a prior-art receiver device having a signal strength detector in the digital signal processor. The device has similar basic elements as in FIG. 1, e.g. the antenna 11, the front end 12, and the analog to digital converter 14. The amplifier 13 now has an automatic gain control input to be controlled by a control signal generated by the received signal strength indicator (RSSI) in a digital signal processor 25. Hence the digital processor has an RSSI output signal 21. In the digital processor 25 the output power of the ADC is measured and the RSSI output signal is created which indicates if the input signal of the ADC is too large or not. This type of AGC arrangement is slow, due to the fact that the signal has to pass the ADC and digital processing first, to be able to detect if the input signal to the ADC is too small or too large.

FIG. 3 shows a signal strength detector coupled to an analog to digital converter. The device has similar basic elements as in FIG. 1, e.g. the antenna 11, the front end 12, and the amplifier 13 having the automatic gain control input to be controlled by a control signal generated by a signal strength detector 32 (RSSI) coupled to the analog to digital converter 31. It is noted that the amplifier has a variable gain in dependence of the control signal for generating an amplified signal from the input signal. The analog to digital converter is for converting the amplified signal into a bitstream signal that represents the input signal by consecutive digital values. The bitstream signal is to be processed further in the digital signal processor 15. The analog to digital converter may include a loop comprising a loop filter, the loop filter being dimensioned for achieving a desired noise characteristic and transfer function of the analog input signal to the digital output signal. Embodiments of the ADC are described below. The signal strength detection circuit 32 is for generating a control signal indicative for an overload condition of the analog to digital conversion. In the overload condition the input signal strength exceeds the input range of the analog to digital converter, i.e. the input signal values are too high or too low to be converted. As a consequence the output digital values of the analog to digital converter are no longer corresponding to the actual values of the analog signal, for example the top part of a sine wave may be converted into a digital signal level corresponding to a constant signal value.

The signal strength detection circuit 32 has a detection circuit for detecting, in the bitstream signal, a sequence of adjacent and equal digital values. The detection circuit compares the length of such sequences to a predetermined length, and when the actual length is larger than the predetermined length, an output detection signal is generated. The signal strength detection circuit 32 may be equipped with logic circuitry or processing circuitry to apply further overload criteria, such as detecting a number of long sequences in a predetermined detection time interval, as explained below. In signal processing architectures, such as receivers for mobile communication, often a Sigma Delta Modulator is used as the analog to digital converter, which modulators generate bitstream signals.

FIG. 4 shows a bitstream signal. The Figure shows a binary bitstream signals as converted by an analog to digital converter (ADC), a maximum signal value being +1 and the minimum signal value being −1. The upper graph 41 shows a first bitstream signal 44 in the event that the analog input signal is substantially zero. Because there is no input signal applied to the ADC, the output will toggle between '+1' and '−1', resulting in an average of 0 at the digital output. The middle graph 42 shows a second bitstream signal 45 in the event that of an analog input signal 46 that is substantially within the input range of the ADC. Because there is the analog signal 46 applied to the ADC, the bitstream signal changes and corresponds to the input signal. The more positive the input signal gets, the more '+1's are generated. The more negative the input signal becomes, the more '−1's are generated. The lower graph 43 shows a third bitstream signal 47 in the event that of an analog input signal 48 that exceeds the input range of the ADC. In general, when the peak input signal amplitude starts to get closer to the maximum allowable signal, e.g. a positive or negative reference voltage in a feedback DAC, more and more consecutive '+1's or '−1's will be generated. When the input signal exceeds the reference voltages, the modulator is overdriven and long sequences of '+1's or '−1's will be generated, as indicated by arrows 49,50. The overdrive condition is detected by counting the number of consecutive '+1's and '−1's. If the number of consecutive equal signal values is more than a certain, predetermined number the circuit detects an overload condition of the ADC, i.e. the modulator is overdriven. The control signal is generated accordingly and may be used to set the gain of a preamplifier (AGC) accordingly.

FIG. 5 shows a sigma-delta analog to digital converter and an overload detection unit. The sigma delta converter includes a loop filter 52 having a transfer function H, a quantizer Q 45 after a sample unit 53 that samples the analog signal at sample frequency $f_s$ to provide an output bitstream signal Y.

The sample frequency is set by: $f_s=\text{OSR}\cdot 2\cdot f_{BW}$, wherein OSR indicates output sample rate and $f_{BW}$ indicates the required bandwidth. The loop provides feedback via a digital to analog converter (DAC) 55 and a summing node 51 receiving an (analog) input signal X and a feedback signal from the loop via DAC 55. The sigma delta modulator provides noise shaping to suppress quantization noise in the signal bandwidth, while leaving the input signal unharmed. The output bitstream signal Y of the sigma-delta modulator is coupled to a detection circuit 56, which generates a control signal 57 based on detecting at least one sequences of same signal values of a required length. As such, detecting the length of sequences in a series of digital values, e.g. ones (or zeroes), can be easily accomplished in various ways, e.g. using standard logical circuits like reset-able counters, comparators and level detectors. Surprisingly, for many applications a sequence of subsequent maximum (or minimum) values that is longer than a predetermined threshold length of 8 effectively indicates the overload condition. Depending on a desired responsiveness, or robustness against short overloads, a longer threshold may be more effective. In practice the predetermined length may be in a range of 8-16, but other values may be selected when appropriate for the input signal to be converted or the type of analog to digital converter.

It is noted that various embodiments of the signal strength detection circuit may be arranged to apply further overload criteria to the detected sequences. Thereto the signal strength detection circuit has overload condition circuitry 58 for detecting the overload condition based on one or more overload criteria. For example, the overload criteria include a requirement for a preset number of sequences to occur in a predetermined detection time interval before the overload condition is actually determined and reported. For example, when there is only a very short overload condition due to a noise spike of click, it might be better not to change the AGC, and sustain several bit errors, because setting the AGC may also cause bit errors.

In a further embodiment, the actual lengths of sequences (which obviously at least have the predetermined length) may be combined, or evaluated applying weight factors. For example a sequence being 50% or 100% longer than the predetermined length may be assigned a large predictive value of overload. Also the lengths of subsequent sequences may be taken into account. A further criterion may be the occurrence of at least one sequence of a minimum digital value occurring within the bitstream and at least one sequence of a maximum digital value occurring within the bitstream. Such occurrences, i.e. both occurring within a limited period of time, indicate that the input signal exceeds the input range at both the maximum positive and the maximum negative side. Obviously also a number of such sequences may be required to occur.

In an embodiment, the signal strength detection circuit 32 includes a threshold memory such as a register for containing the length threshold for detecting the long sequences. By setting the value of the threshold, the predetermined length is adapted for accommodating the detection of a periodic signal component in an expected frequency range. For example a received signal may be modulated using a carrier wave, or may be down converted to a known frequency, and hence contains a substantial periodic signal component of that frequency. The length threshold may be adapted to the expected frequency, e.g. to 25% of the length of the period thereof.

In an embodiment the device comprises the analog to digital converter, e.g. in an integrated circuit. In a particular case the analog to digital converter may be of the sigma delta type, for example for generating the bitstream signal of single bit values by oversampling. Alternatively the sigma delta modulator may generate multi bit values.

FIG. 6 shows an output signal of a multi-bit sigma-delta modulator. A large graph 60 shows a multi bit output signal 61 as converted by a multi-bit sigma-delta modulator. A detail graph 65 shows a multi bit signal 62, which is a zoomed out part of the output signal 61 as indicated by arrow 64. The peak value of the (sinusoidal) input signal is assumed just to be at the maximum input range, and a short sequence of consecutive maximum values 63 is indicated in the detailed graph 65. If the input signal substantially exceeded the maximum input range, a long sequence of consecutive maximum values would occur and be detected by the detection circuit 56 (in FIG. 5). It is noted that the Figure shows a multi bit signal of a fourth order, 32-level sigma delta modulator. In such a signal one has to monitor the highest (and lowest) output level for the occurrence of subsequent ones (and zeroes). For the multi-bit output signal a sequence of subsequent ones (or zeroes) at the highest (or lowest) level exceeding a preset threshold length, e.g. 8 or 10, indicates the overload condition. Note that the other levels provide no substantial source of overload information, and hence the detection circuit may be deactivated, i.e. to be (re)activated only at the highest (and lowest) output level.

Further embodiments of the device may contain, in addition to the signal strength indicator, an amplifier having a variable gain, and/or further signal processing or receiver elements as shown in FIG. 3. The gain of the amplifier is dependent on a gain control signal for generating an amplified signal to be converted by the analog to digital converter, which gain control signal is provided applying the control signal from the signal strength indicator.

Although the invention has been explained mainly by embodiments based on sigma delta type analog to digital converters having loop filters, it is noted that in the invention may be implemented using any type of analog to digital converter that generates a series of digital output values, such as band pass sigma delta modulators, Nyquist converters and so on. The series of digital output values should correspond in a predictable way to input signal levels, but may degrade to contain sequences of same values in overload conditions. Further it is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' may be represented by the same item of hardware. Further, the scope of the invention is not limited to the embodiments, and the invention lies in each and every novel feature or combination of features described above.

The invention claimed is:

1. Device for digitally processing an input signal that is susceptible to variations in signal strength and is converted by an analog to digital converter into a bitstream signal to be processed, the bitstream signal representing the input signal by consecutive digital values, the device comprising a signal strength detection circuit for generating a control signal indicative for an overload condition in which the signal strength exceeds an input range of the analog to digital converter, the signal strength detection circuit comprising detection means for detecting in the bitstream signal a sequence of adjacent and equal digital values, the sequence having at least a predetermined length, wherein the detection means is further configured to count a number of consecutive bits having equal digital values.

2. Device as claimed in claim 1, wherein the detection means are arranged for detecting the sequence by detecting a consecutive number of digital signal values of a minimum digital value occurring within the bitstream, the consecutive number being equal to or larger than the predetermined length.

3. Device as claimed in claim 2, wherein the predetermined length is between 8 and 16.

4. Device as claimed in claim 1, wherein the signal strength detection circuit comprises overload condition means for detecting the overload condition based on one or more overload criteria, the overload criteria including
   a number of sequences in a predetermined detection time interval;
   lengths of subsequent sequences;
   occurrence of at least one sequence of a minimum digital value occurring within the bitstream and at least one sequence of a maximum digital value occurring within the bitstream.

5. Device as claimed in claim 1, wherein the signal strength detection circuit is arranged for adapting the predetermined length for accommodating the detection of a periodic signal component in an expected frequency range.

6. Device as claimed in claim 1, wherein the device comprises the analog to digital converter, in a particular case the analog to digital converter being of a sigma delta type, and/or being arranged for generating the bitstream signal of single bit or multi bit values.

7. Device as claimed in claim 1, wherein the device comprises an amplifier having a variable gain in dependence of a gain control signal for generating an amplified signal to be converted by the analog to digital converter, and the control signal constitutes the gain control signal.

8. Mobile communication device, the device comprising a device for digitally processing an input signal as claimed in claim 1, and a receiving unit for providing the input signal.

9. Device as claimed in claim 1, wherein the detection means are arranged for detecting the sequence by detecting a consecutive number of digital signal values of a maximum digital value occurring within the bitstream, the consecutive number being equal to or larger than the predetermined length.

* * * * *